Sept. 17, 1968 W. C. PAINTER 3,402,303

LEVEL SENSITIVE SWITCHING CIRCUIT UTILIZING A ZENER DIODE FOR DETERMINING SWITCHING POINTS AND SWITCHING SENSITIVITY

Filed Aug. 17, 1964

INVENTOR
WALTER C. PAINTER
BY
George T. Craig
Attorney 3,402,303
Patented Sept. 17, 1968

3,402,303

LEVEL SENSITIVE SWITCHING CIRCUIT UTILIZING A ZENER DIODE FOR DETERMINING SWITCHING POINTS AND SWITCHING SENSITIVITY

Walter C. Painter, Bethel Park, Pa., assignor to Radio Corporation of America, a corporation of Delaware Filed Aug. 17, 1964, Ser. No. 389,921
2 Claims. (Cl. 307—235)

ABSTRACT OF THE DISCLOSURE

An improved level sensitive switching circuit is provided wherein the anode of a Zener diode is coupled to a load amplifier. The cathode of the Zener diode is coupled to the emitter of a normally cutoff input transistor amplifier. The load amplifier is in saturation when the Zener diode voltage input level causes Zener conduction and when the Zener diode input voltage drops below the Zener breakdown voltage, the load amplifier is cut off. An output load resistor for the normally cutoff input transistor amplifier is connected to the emitter of the input transistor amplifier to provide a more negative voltage output when the transistor conducts. When the input signal to the input transistor amplifier exceeds a given level, the input amplifier load current through the load resistor increases the voltage drop across the resistor and reduces the bias of the Zener diode below the breakdown voltage resulting in cutoff of the load amplifier.

Figure 1:
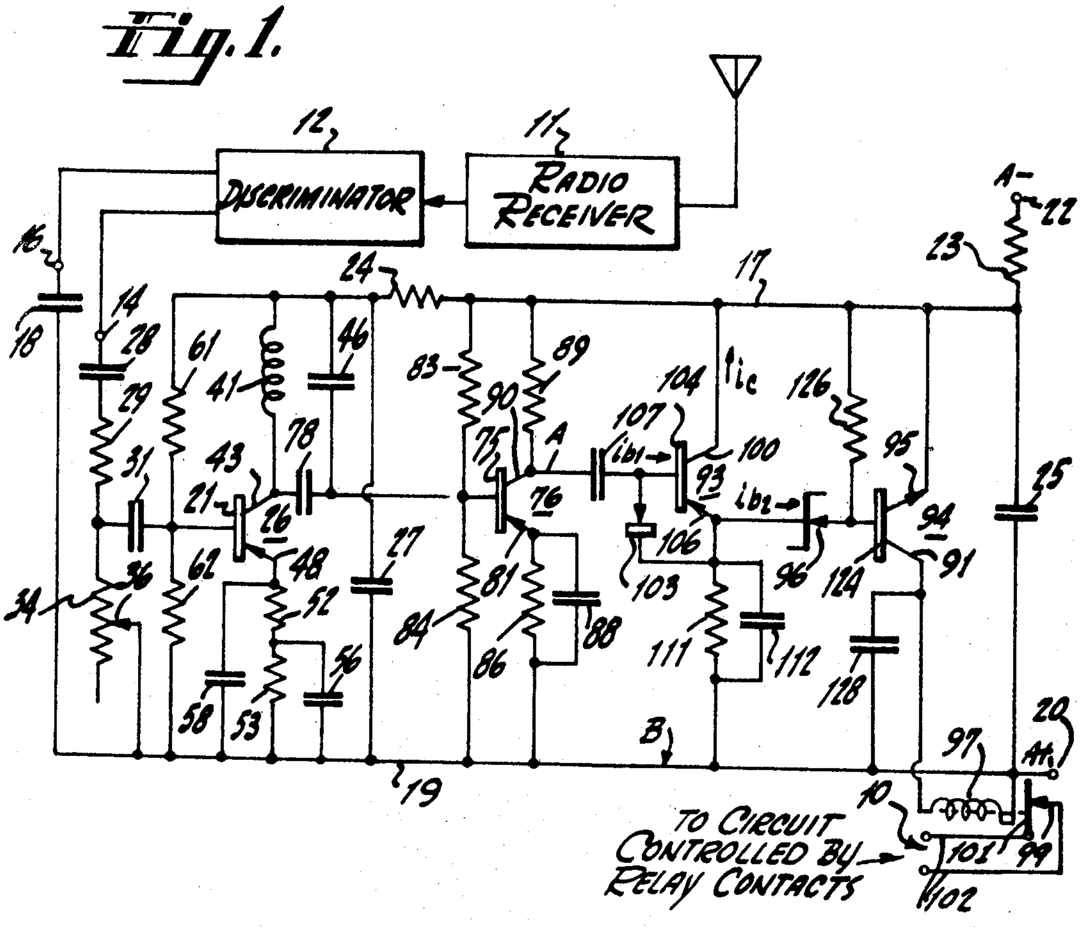

The present invention relates to switchnig circuits, generally, and more particularly to a novel circuit responsive to the level of an input signal to control the response of an amplifier having an output load circuit including a switching device, for example.

An object of the present invention is to provide a novel circuit which is responsive to the level of an input signal whereby to control its output.

Another object of the invention is to provide a stable level sensitive switching circuit.

A further object of the present invention is to provide a novel two stage switching circuit having interstage means to cause a change in operation of the second stage in response to a predetermined input signal level to the first stage.

A still further object of the present invention is to provide a novel circuit for controlling operation of a switching device in response to the reception of a carrier signal by a carrier signal receiver.

One advantage of a level sensitive switching circuit embodying the present invention is that it avoids positive feedback and its inherent disadvantages. The interstage means, for example, a Zener diode, determines the switching points and switching sensitivity.

Another advantage is that D.C. (direct current) coupling between the stages is accomplished without substantially decreasing the overall circuit temperature sensitivity.

In accordance with the present invention switching at a predetermined signal input level is effected by bias voltage changes at the cathode of a Zener diode in response to changes in signal input level. When the input level reaches a predetermined value, operating bias formerly supplied through the Zener diode to an amplifier in a state of heavy conduction is substantially removed to cut off the amplifier. Any desired device, for example, a relay coil, may be coupled to or included in the output circuit of the amplifier.

In a particular circuit embodying the present invention the input signal is applied to the control electrode of a first amplifier. The control electrode bias circuit of a second amplifier includes the Zener diode. The cathode of the Zener diode is connected at or near the end of a resistor connected to the output electrode of the first amplifier. When the level of the input signal is below a predetermined value, substantially no first amplifier load current is drawn through the resistor and the voltage at the end of the resistor connected to the Zener diode cathode is sufficiently positive to cause flow of Zener current to bias the second amplifier into its state of heavy load current conduction. When the input signal exceeds the predetermined level the first amplifier load current flow through the resistor increases to increase the voltage drop across the resistor and reduce the reverse bias across the Zener diode so that the Zener current is not maintained, resulting in cut off of the second amplifier by removal of bias from its control electrode.

Figure 2:
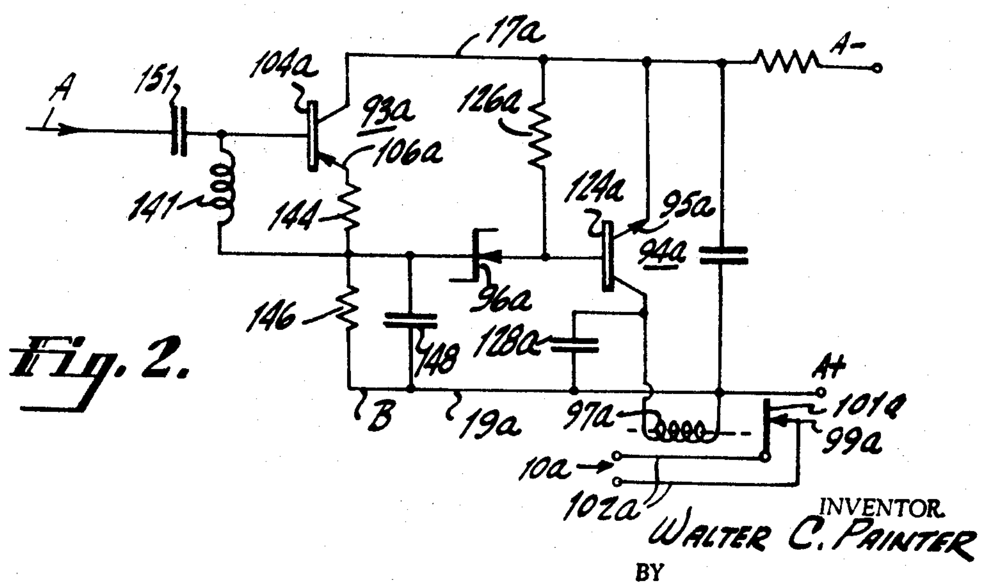

The invention will be described in greater detail by reference to the accompanying drawing in which:

FIGURE 1 is a schematic diagram of a carrier operated relay system embodying the present invention; and FIGURE 2 is a schematic diagram of a modification.

By way of example the invention is disclosed and will be described as embodied in a system in which a magnetic relay 10 is operable in response to the demodulated output of a radio receiver. The demodulated signal, for example the output of the discriminator 12 of a radio receiver 11, is fed to terminals 14 and 16. A capacitor 18 is relatively large and couples the terminal 12 to a conductor 19 serving as a voltage reference bus or common circuit connection for the carrier operated relay system. The conductor 19 may be replaced by chassis ground depending on the circuitry of the associated radio receiver (not shown).

The positive and negative terminals of a voltage source (not shown) are connected to terminals 20 and 22, respectively. The conductor 19 and a conductor 17 are the positive and negative voltage supply buses, respectively. The conductor 17 is supplied through a resistor 23 followed by a decoupling capacitor 25, and the conductor 17 leads through a resistor 24 to provide a reduced voltage. Resistor 24 is followed on the low voltage side by a decoupling capacitor 24.

Terminal 14 is coupled to the base 21 of a transistor 26 by a relatively small capacitor 28, a resistor 29 and a blocking and coupling capacitor 31. The elements 28 and 29 function as a high pass filter to accentuate noise output from the wide band discriminator 12. This noise output is large in amplitude when a carrier signal is not present in the input to the receiver.

A rheostat, comprising a resistor 34 and a slider contact 36, connected across the input to the transistor 26, serves as a gain control in the input to determine the noise level at which the relay 10 will be energized.

The transistor 26 serves as a selective amplifier tuned to 13.5 kc. (kilocycles per second), for example, so that the amplifier noise output is representative of the noise output of the discriminator. Tuning at 13.5 kc. avoids effects of receiver audio which is in the 300 to 3000 c.p.s. (cycles per second) range.

An inductor 41 in the output lead of the collector 43 and a capacitor 46 tune the output of the transistor 26. The emitter 48 and collector 43 are biased by the previously mentioned voltage source (not shown). The emitter 48 is biased from the positive bus 19 through resistors 52 and 53. Resistor 53 is shunted by a relatively large capacitor 56. A capacitor 58 of smaller value shunts both resistors and reduces negative feedback in the desired frequency range about 13.5 kc. and increases negative feedback (reduces gain) in the audio range 300–3000 c.p.s. Forward bias for the base 21 with respect to the emitter 48 is provided by resistors 61 and 62 connected in series through resistor 24 between the positive bus 19 and the conductor 17.

The base 75 of a second transistor 76 is coupled to the collector 43 of the transistor 26 by a coupling capacitor 78 and is biased with respect to the emitter 81 by resistors 83 and 84 connected in series between the negative bus 17 and the positive bus 19. Bias voltage is applied to the emitter 81 through a resistor 86 bypassed by a capacitor 88. An output load resistor 89 is connected between the negative bus 17 and the collector 90.

Transistors 93 and 94, and a Zener diode 96 operate in combination as the level sensitive switching circuit. In the illustrative example the transistors 93 and 94 are PNP and NPN types, respectively. The diode 96 is a reference voltage or Zener diode. The Zener diode is reverse biased, as will appear from the following description, and the reverse current is very low for reverse voltages up to and definite value called the avalanche or Zener voltage. When this reverse Zener voltage is applied there are relatively large increases in current for further small increases in reverse voltage. The voltage is, therefore, substantially constant over a wide range of current. The Zener voltage and the abrupt decrease in reverse current is used to provide the level sensitive property of the switching circuit. In the illustrative example of the accompanying drawing the noise input provides an indication of absence of carrier signal. However, the input signal to the transistor 93 may originate from any system or source having a D.C. or A.C. output. The output load current of the transistor 94 increases when the amplified noise output from the transistor 76 decreases to a predetermined value. The emitter 95 of the transistor 94 is connected directly to the negative bus 17. The output load of the collector 91 of the transistor 94 is, for example, the coil 97 of the magnetic relay 10 energized when the signal input level of the transistor 93 decreases to a predetermined value. The stationary contact 99 of the relay is shown as engaging the magnetically actuated relay contact or tongue 101 when the relay is deenergized. The relay contact 99 may be readily be arranged so that the relay contact circuit, indicated schematically at 102, is closed when the relay 10 is energized. It will be understood that any type of transistor load may be substituted for the coil 97 of the relay 10.

The transistor 93 is connected as a common collector stage to serve as a switch and as a rectifier. The collector 100 is connected directly to the negative bus 17. A diode 103 is connected between the base 104 and the emitter 106 to keep these elements at the same D.C. level so that this transistor is quiescently biased at cutoff. The base-emitter junction of the transistor 93 acts as a rectifier to pass negative half-cycles of the A.C. (alternating current) input. The diode 103 aids this action by bypassing the positive half-cycles of the A.C. input.

The base 104 of the transistor 93 and the anode of the diode 103 are coupled to the collector 90 of the transistor 76 through a coupling capacitor 107. If the capacitor 107 is not used the input signal between the points A–B, indicated on the drawing, may be D.C. The emitter 106 is connected to the positive bus 19 by way of a resistor 111. A filter capacitor 112 is connected in parallel with the resistor 111. The resistor 111 is the load resistor of the common collector stage. The collector to emitter resistance of the transistor 93 in combination with the resistor 111 and Zener diode 96 is employed in a manner to be explained.

The base 124 of the transistor 94 is connected to the anode of the Zener diode 96. The diode cathode is connected to the emitter 106 of the transistor 93 and thereby to the positive bus through the resistor 111. When there is no A.C. signal applied across the points A–B, the effective collector to emitter resistance of the transistor 93 is very high and the emitter current due to transistor action is negligible. Under this condition base current $i_{b2}$ for the transistor 94 flows through the resistor 111 and the Zener diode 96. The voltage drop from the positive bus 19 to the base is the voltage drop across resistor 111 plus the Zener breakdown voltage of the reverse biased Zener diode 96. The flow of base current to the base 124 with the transistor 93 substantially in cutoff causes the transistor 94 to be driven into saturation and conduct heavily to energize the coil 97 of the relay 10.

When an A.C. signal is applied at the points A–B a D.C. current $i_{b1}$ flows in the base 104 of the transistor 93 due to the rectifier action of the base 104-emitter 106 junction and the diode 103. The effective collector to emitter resistance of the transistor 93 now depends on the level of the current $i_{b1}$ to the base 104. The capacitor 112 filters the rectified base current $i_{b1}$. A resistor 126 serves to linearize the load resistance presented to the Zener diode 96. This load resistance is the parallel combination of the resistor 111 and the non-linear input resistance of the transistor 94.

Increasing the input signal at the points A–B increases the current $i_{b1}$ and this in turn decreases the collector to emitter resistance of the transistor 93. The transistor 93 now conducts a current $i_C$ through the resistor 111. This current $i_C$ increases the voltage drop through the resistor 111.

When the voltage drop across the resistor 111 reaches a value such that the Zener diode no longer conducts because of decreased reverse bias, this diode is then in its high resistance or "off" condition. This causes the current $i_{b2}$ to be reduced substantially to zero and transistor 94 goes into cutoff de-energizing the relay coil 97.

When the voltage drop across the resistor 111 reaches Zener diode again conducts and the relay coil 97 is energized. Changing the A.C. input level by .25 db (decibels) is sufficient to cause the relay to be energized or de-energized depending on whether the A.C. signal is increased or decreased. A capacitor 128 serves to adjust the operate speed of the relay 10. Large capacitance values of the capacitor slow down operation of the relay.

By way of example, the capacitors in FIGURE 1 of the drawing may have the following values:

| | | |
|---|---|---|
| Capacitor **18** | mfd | 1 |
| Capacitor **25** | mfd | 50 |
| Capacitor **27** | mfd | 50 |
| Capacitor **28** | mmf | 400 |
| Capacitor **31** | mfd | .5 |
| Capacitor **46** | mfd | .015 |
| Capacitor **56** | mfd | 25 |
| Capacitor **58** | mfd | .1 |
| Capacitor **78** | mfd | .005 |
| Capacitor **88** | mfd | 25 |
| Capacitor **107** | mfd | 15 |
| Capacitor **112** | mfd | 22 |
| Capacitor **128** | mfd | 50 |

By way of example, the resistors may have the following values:

| | Ohms |
|---|---|
| Resistor **23** | 10 |
| Resistor **24** | 500 |
| Resistor **29** | 100K |
| Resistor **34** | [1] 7.5K |
| Resistor **52** | 1K |
| Resistor **53** | 4K |
| Resistor **61** | 47K |
| Resistor **83** | 5K |
| Resistor **84** | 5K |
| Resistor **86** | 560 |
| Resistor **89** | 140 |
| Resistor **111** | 500 |
| Resistor **114** | 2200 |
| Resistor **126** | 500 |

[1] Variable.

FIGURE 2 of the drawing shows a modification in which an inductor 141 is used in place of the diode 103 of FIGURE 1, and an unbypassed feedback resistor 144 in the emitter circuit of the transistor **93*a* is added. This modification provides improved circuit gain and a somewhat higher stability factor for the stage including the transistor 93*a***.

The input circuit coupled across the points A–B may be the same as, or similar to, that in FIGURE 1 including transistors 26 and 76, or it may be any varying A.C. voltage. The emitter **95*a* of the transistor 94*a* is connected to the negative bus 17*a*. The base 124*a* of the transistor 94*a* is connected to the anode of the Zener diode 96*a*. The cathode is connected to the junction of resistor 144 and a resistor 146 bypassed by a capacitor 148. The resistor 126*a* is connected to the negative bus 17*a*. The resistor 126*a* corresponds in function to the resistor 126** of FIGURE 1.

The inductor 141, unlike the diode 103 of FIGURE 1, presents a high A.C. impedance to A.C. input signals across points A–B. The D.C. input resistance of the inductor is very small and, therefore, makes possible the excellent D.C. stability factor mentioned above. The stage stability factor S is equal to the D.C. resistance of the inductor 141 divided by the resistance of the resistor 144. With the component values, given later by way of example, the factor S is equal to two. The unbypassed emitter resistor 144 provides negative A.C. signal feedback and tends to stabilize the stage gain with respect to temperature variations and transistor beta variations. The beta of a transistor is the ratio between the collector current and the base current.

There is substantially no forward bias on the base **104*a* of the transistor 93*a* as the coupling capacitor 151 blocks D.C. from a preceding stage. Also, the ohmic value of the resistor 144, which carries the emitter current, is small in proportion to the value of the resistor 146 and the difference in voltage between the base 104*a* and the emitter 106*a* is small. Since there is no forward bias on the transistor 104*a*** it accomplishes rectification of the A.C. input signal by conducting only on the negative half cycle.

If the input circuit across the points A–B is the same as, or similar to, the noise selective circuit of FIGURE 1 so that this input is near one frequency, for example 13.5 kc. the value of capacitance of the capacitor 151 can be selected to peak the response of the level sensitive switching circuit in a desired pass-band, for example, the previously mentioned 13.5 kc. Also, the inductor 141 is useful in this respect since its value of inductance can be selected to resonate with capacitor 151. By using appropriate values of inductance and capacitance, the circuit can be peaked at any desired frequency.

The output load for the transistor **94*a* is shown by way of example as the coil 97*a* of the relay 10*a*. The contact 99*a* and the relay tongue 101*a* may be connected as shown or the relay 10*a* may have a contact arrangement which closes the external circuit upon energization of the relay coil 97*a*. The value of capacitor 128*a*** may be selected to time the relay.

By way of example, the capacitors in FIGURE 2 of the drawing may have the following values:

| | Mfd. |
|---|---|
| Capacitor **151** | .0012 |
| Capacitor **148** | 22 |

For a pass-band centered at approximately 13.5 kc. the inductor 141 may have a value of 60 mh. for the given value of the capacitor 151.

By way of example, the resistors in FIGURE 2 of the drawing may have the following values:

| | Ohms |
|---|---|
| Resistor **126*a*** | 3.3K |
| Resistor **144** | 27 |
| Resistor **146** | 3.3K |

In FIGURE 1 the transistors 26, 76 and 93 may be of the NPN type and transistor 94 will then be of the PNP type. The Zener diode 96 will be reversed in polarity and the voltage supply polarity will be reversed. In FIGURE 2 transistors **93*a* and 94*a*** may be NPN and PNP types, respectively with the Zener diode reversed in polarity and the voltage supply polarity reversed.

What is claimed is:

1. A level sensitive switching circuit comprising, a first transistor having base, emitter and collector electrodes, a diode having its anode connected to said base and its cathode connected to said emitter, means to couple a received input signal between said base and collector electrodes, a bias voltage source having a first and a second terminal with said first terminal connected to said collector, an output load resistor for said transistor connected between said emitter and said second terminal to provide a more negative voltage output when said transistor conducts in response to an input signal of increasing amplitude, a second transistor having a base, emitter and collector electrodes, a connection from said second transistor emitter to said first terminal of said bias voltage source, a load connected between said second terminal and said second transistor collector, a reverse biased diode having a cathode and anode capable of becoming conductive when its reverse bias voltage exceeds a pre-selected value, said cathode and anode of said reverse biased diode connected to said first transistor emitter and said second transistor base, respectively, said load resistor providing a reverse bias for said reverse biased diode when said first transistor is in the cut off state whereby to cause said second transistor to conduct and energize said load.

2. A level sensitive switching circuit comprising, a first transistor having base, emitter and collector electrodes, means to couple a received input signal between said base and collector electrodes, a bias voltage source having a first and a second terminal with said first terminal connected to said collector, a degenerative resistor, an output load resistor for said transistor connected in series with said degenerative resistor between said emitter and said second terminal to provide a more negative voltage output when said transistor conducts in response to an input signal of increasing amplitude, an inductor connected to said base and to the junction of said degenerative resistor and said load resistor, a second transistor having a base, emitter and collector electrodes, a connection from said second transistor emitter to said first terminal of said bias voltage source, a load connected between said second terminal and said second transistor collector, a reverse biased diode having a cathode and anode capable of becoming conductive when its reverse bias voltage exceeds a pre-selected value, said cathode connected to the junction of said degenerative resistor and said load resistor and said anode connected to said second transistor base, said load resistor providing a reverse bias for said diode when said first transistor is in the cut off state whereby to cause said second transistor to conduct and energize said load.

References Cited

UNITED STATES PATENTS

| | | | |
|---|---|---|---|
| 2,994,784 | 8/1961 | White et al. | |
| 3,121,175 | 2/1964 | Vigneron | 307—88.5 |
| 3,191,066 | 6/1965 | Staudenmayer | 307—88.5 |

ARTHUR GAUSS, *Primary Examiner.*

S. D. MILLER, *Assistant Examiner.*

U.S. DEPARTMENT OF COMMERCE

PATENT OFFICE

Washington, D.C. 20231

UNITED STATES PATENT OFFICE
CERTIFICATE OF CORRECTION

Patent No. 3,402,303

September 17, 1968

Walter C. Painter

It is certified that error appears in the above identified patent and that said Letters Patent are hereby corrected as shown below:

Column 1, line 33, "switchnig" should read -- switching --. Column 3, line 38, "and" should read -- a --. Column 4, line 52, "When the voltage drop across resistor 111 reaches" should read -- When the signal across the points A-B is reduced the --.

Signed and sealed this 10th day of March 1970.

(SEAL)
Attest:

Edward M. Fletcher, Jr.
Attesting Officer

WILLIAM E. SCHUYLER, JR.
Commissioner of Patents